US005153914A

United States Patent [19]

Iwano

[11] Patent Number: 5,153,914

[45] Date of Patent: Oct. 6, 1992

[54] SOUND EQUIPMENT SYSTEM

[75] Inventor: Akihiro Iwano, Tokorozawa, Japan

[73] Assignee: Kabushiki Kaisha Seidenko, Tokyo, Japan

[21] Appl. No.: 635,465

[22] Filed: Dec. 28, 1990

[30] Foreign Application Priority Data

Dec. 28, 1989 [JP] Japan .............................. 1-341014

[51] Int. Cl.[5] .............................. H03G 11/00

[52] U.S. Cl. .............................. 381/55; 381/28; 381/85; 381/116; 381/120; 330/197

[58] Field of Search .............................. 381/55, 28, 82, 85, 381/117, 120, 77, 116; 330/195, 196, 197; 340/669, 870.02, 781, 825.81; 250/206, 227.21; 315/136, 151, 159

[56] References Cited

U.S. PATENT DOCUMENTS 2,030,573 2/1936 Dull .............................. 381/109
4,289,936 9/1981 Civitello .............................. 381/116
4,323,736 4/1982 Strickland .............................. 381/116
4,864,624 9/1989 Tichy .............................. 381/55

OTHER PUBLICATIONS

LM380, National Semi-Conductor and Power Audio Amplifier 1922, p. AN69-4.

*Primary Examiner*—Forester W. Isen
*Assistant Examiner*—Nina Tong
*Attorney, Agent, or Firm*—Ladas & Parry

[57] ABSTRACT

In a sound system having a sound source for generating sound signals, a low-impedance amplifier for amplifying the generated sound signals, and high-impedance loudspeakers for reproducing audible sound from the amplified sound signals, an impedance conversion device having a step-up transformer section is disconnectably connected between the amplifier and the high-impedance speakers. The output side of the low-impedance amplifier is also connected directly to low-impedance loudspeakers. Thus the sound system can be operated to selectively broadcast either monaural sound or binaural stereo music of high quality.

1 Claim, 3 Drawing Sheets

SOUND EQUIPMENT SYSTEM

BACKGROUND OF THE INVENTION

This invention relates generally to sound equipment systems of the type provided with a sound source, an amplifier, and one or more loudspeakers (hereinafter referred to as speakers). More particularly the invention relates to a sound equipment system of this type wherein either of low-impedance speakers and high-impedance speakers can be selectively used.

In large buildings such as schools, hospitals and department stores and in public facilities, emergency sound broadcasting equipment as prescribed by the regulations concerning disasters of local law are installed. Ordinarily, for this emergency sound broadcasting equipment, a sound equipment system of high-impedance type is adopted. In many cases this sound equipment system is utilized to broadcast music.

In residences or homes, in general, stereo sound systems of low-impedance type are widely used. By these systems, stereo music of good sound quality can be readily reproduced.

In the design of public-address systems of the high-impedance type widely adopted as emergency broadcasting equipment in places such as large buildings and public facilities as mentioned above, top priority is given to characteristics such as sound pressure and durability so as to meet the safety standards prescribed by the local law. For this reason, these systems are ordinarily of the monaural type, and to date not much consideration has been given to the various characteristics relating to sound quality. Therefore, in the case where a broadcasting system of this monaural high-impedance type is used for musical reproduction, it is difficult to obtain good sound quality.

On the other hand, the installing of a stereo sound system of low-impedance type generally used in homes in a spacious building gives rise to problems in that demerits relating to function and installation increase. More specifically, in many large buildings, stereo music can be listened to in quiet environments such as individual or private rooms and other spaces such as corridors or hallways. Such places however are generally remote from the sound source and the amplifier as, for example, in a building with several floors. When a sound equipment system capable of reproducing stereo music at each of these places in such a building is to be organized and installed, the installing of the wiring of this system of low-impedance type becomes complicated. In addition, the length of the speaker cables is also subject to limitation.

SUMMARY OF THE INVENTION

The present invention has been created in view of the above described problems. It is a general object of the invention to provide a sound equipment system which is provided with an impedance conversion device and is capable of selectively using low-impedance speakers and high-impedance speakers.

According to this invention, briefly summarized, there is provided a sound equipment system comprising: a sound source for generating sound signals; an amplifier for amplifying the sound signals thus generated; a plurality of loudspeakers for reproducing audible sound from the sound signals thus amplified; and an impedance conversion device installed in a freely connectable and disconnectable manner between the amplifier and the loudspeakers and provided with a transformer section and connection terminals respectively of the amplifier and of the loudspeakers.

According to the present invention, an impedance conversion device is connected between the amplifier and the speakers, whereby it becomes possible to match speakers of different impedances and thereby to use them in a single sound system. For example, by connecting to a low-impedance amplifier an impedance conversion device provided with a step-up transformer section for converting low-impedance into high-impedance, high-impedance speakers can be used as music reproducing speakers.

The nature, utility, and further features of the present invention will be more clearly apparent from the following detailed description with respect to preferred embodiments of the invention when read in conjunction with the accompanying drawings.

DESCRIPTION OF THE PREFERRED EMBODIMENT

Figure 1:
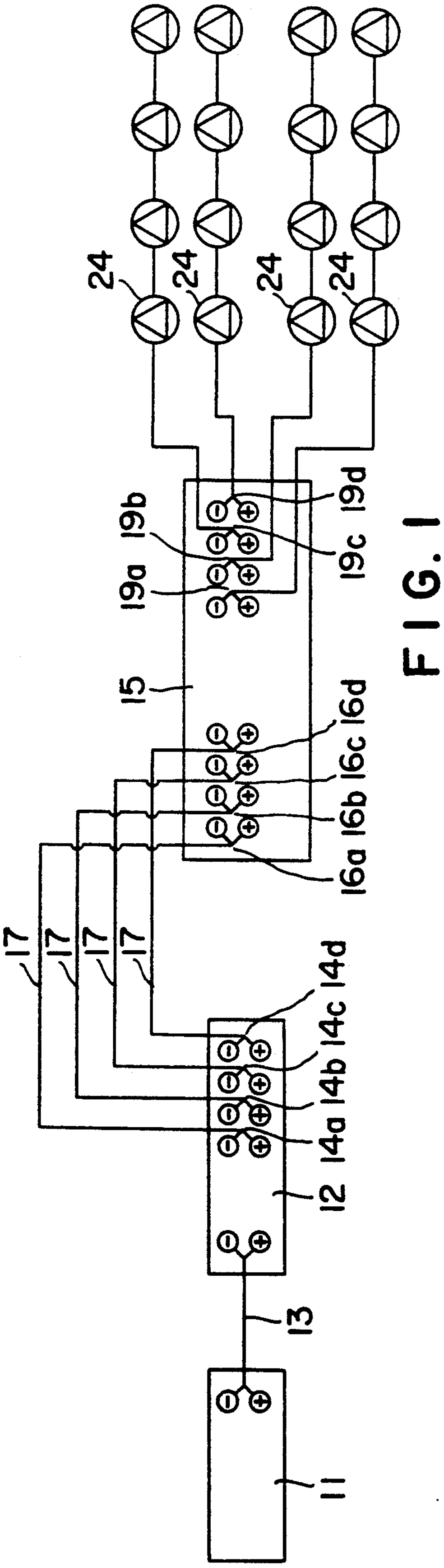
FIG. 1 is a circuit diagram of an example of a sound equipment system constituting a first embodiment of this invention.

In an example as shown in FIG. 1 of a sound equipment system constituting a first embodiment of the present invention, a sound source 11 such as a stereo music reproducing device or a microphone is provided. This sound source 11 is connected by a conductor cord 13 to a low-impedance amplifier 12. The low-impedance amplifier 12 in this example is of the 4-channel output type and is provided with four output terminals **14*a*, 14*b*, 14*c*, and 14*d*. These output terminals are respectively connected by conductor cords 17 to input terminals 16*a*, 16*b*, 16*c*, and 16*d* of an impedance conversion device 15**.

Figure 2:
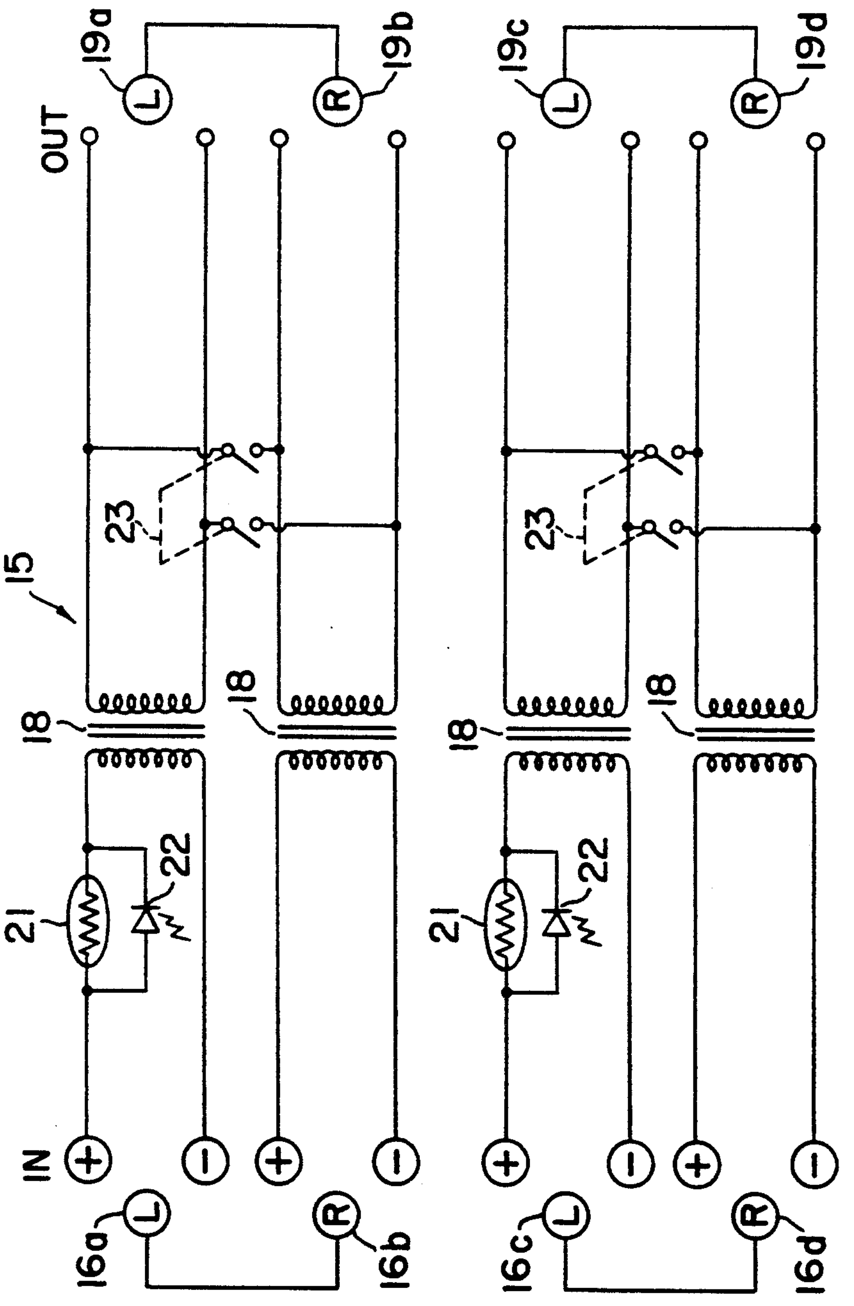
FIG. 2 is a circuit diagram showing one example of an impedance conversion device according to the invention.

This impedance conversion device 15 has step-up transformers 18 for changing over the impedance from low-impedance (4Ω to 16Ω) to high-impedance (50Ω to 10KΩ) as shown in FIG. 2 illustrating the circuit of this device. In the circuits on the primary sides of these step-up transformers 18 (i.e., on the left-hand sides thereof as viewed in FIG. 2), posistors 21 are provided in series together with the input terminals **16*a* through 16*d*. Each of these posistors 21 is one kind of semiconductor having the characteristic of having a resistance which increases with increasing current passing therethrough. By the use of these posistors 21, a protective function against excessively high current, or overcurrent, is afforded. Furthermore, a light-emitting component (LED) 22 is connected in parallel across the two terminals of each posistor 21**.

In the circuits on the secondary sides of the step-up transformers 18 (i.e., on the right-hand sides thereof as viewed in FIG. 2), output terminals **19*a*, 19*b*, 19*c*, and 19*d* of the impedance conversion device 15 are provided. Also in the circuits on the secondary side, mode switches 23** for connecting left (L) side circuits and right (R) side circuits are provided. By thus connecting the left and right side circuits, the sound signals flowing respectively therethrough can be mixed to obtain monaural mixing.

To the output terminals 19*a* through 19*d* of the impedance conversion device 15 are connected a plurality of high-impedance speakers 24 in a manner to enable binaural listening of 2-channel stereo music. In the example illustrated in FIG. 1, four rows of speakers in each of which several speakers 24 are connected in series are shown. However, the number and arrangement of these speakers can be appropriately varied to suit each installation.

In the operation of the sound equipment system of the above described organization, a sound signal transmitted from the sound source 11 is amplified by the low-impedance amplifier 12 and then sent to the impedance conversion device 15. In the impedance conversion device 15, low-impedance is converted by the step-up transformers into high impedance. As a final result, speaker outputs can be obtained with high-impedance.

If, during operation, an excessively large current should flow through the impedance conversion device 15, the resistances of the posistors 21 in the circuits on the primary side thereof increase. Thus, flow of overcurrent through the speakers 24 is suppressed. Furthermore, when the resistance of each posistor 21 increases, and the voltage difference between its terminals becomes large, the LED connected thereacross becomes lit thereby to indicate that an overcurrent has flowed. By installing the posistors 21 and the LEDs 22 in this manner, it becomes possible to adjust overcurrent to the speakers 24 while visually confirming the same with the transmission of the sound signal in continued state. Therefore, protection of the speakers 24 and reproduction of sound can be continuously sustained.

Through the operation of the impedance conversion device 15, the low-impedance amplifier 12 can be converted into an amplifier having the function of a high-impedance amplifier. Therefore, 2-channel stereo music or a single-channel binaural sound can be reproduced by the high-impedance speakers 24 connected to the output terminals 19*a* through 19*d* of the impedance conversion device 15.

Thus, according to the instant example, an impedance conversion device 15 is connected to the output side of a low-impedance amplifier 12, which thereby can be converted into an amplifier having the function of a high-impedance amplifier. By this feature, a sound equipment system of high-impedance type heretofore used as a monaural system can be used as a stereo system. Furthermore, by merely connecting an impedance conversion device 15 to a low-impedance amplifier 12 of relatively low price which is widely used in general as a stereo amplifier, a high-impedance sound equipment system can be realized. Thus, a sound equipment system operable doubly as sound broadeasting equipment producing high-quality sound can be readily produced at low cost.

Figure 3:
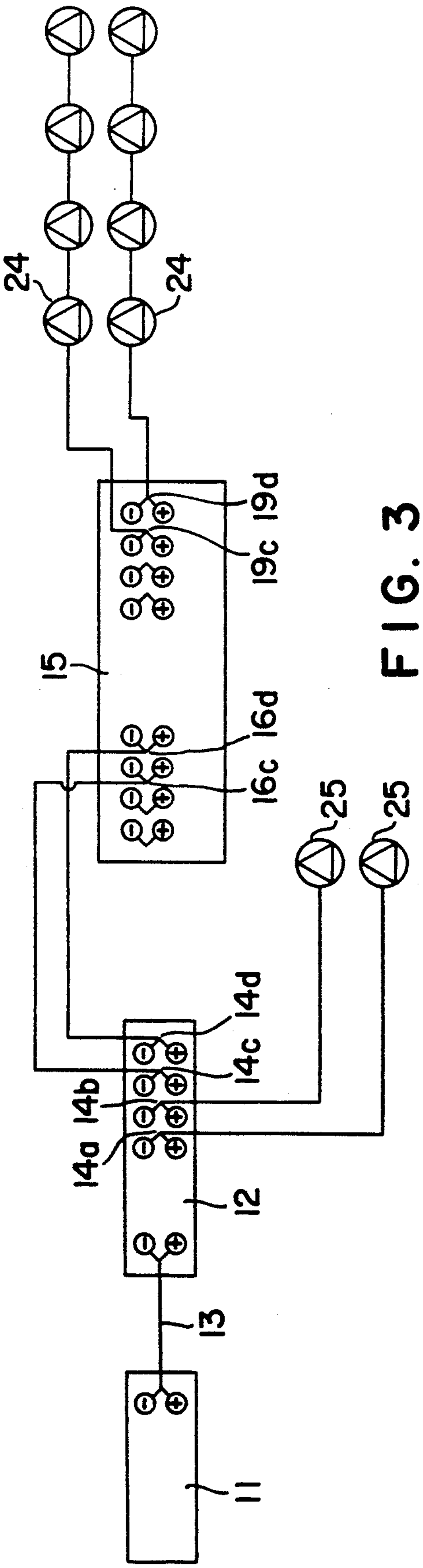
FIG. 3 is a circuit diagram of an example of a sound system constituting a second embodiment of the invention.

In a second embodiment of this invention as shown by a circuit diagram in FIG. 3, a musical signal from a single sound source 11 can be reproduced by using simultaneously both low-impedance speakers 25 and high-impedance speakers 24.

More specifically, in this example also, a low-impedance amplifier 12 is used and has four output terminals 14*a*, 14*b*, 14*c*, and 14*d*. Of these four output terminals, two terminals 14*a* and 14*b* are connected directly to respective low-impedance speakers 25. The remaining output terminals 14*c* and 14*d* are connected to input terminals 16*c* and 16*d* of an impedance conversion device 15 similar to that of the preceding example. High-impedance speakers 24 are connected to output terminals 19*c* and 19*d* of the impedance conversion device 15.

A sound equipment system of this character can be applied, for example, in the following manner in a private residence of relatively large size. A low-impedance amplifier 12 is installed in a private room together with low-impedance speakers 25. High-impedance speakers 24 are installed at places such as corridors and upper floor places that are remote from the amplifier 12. By this arrangement, reproduced stereo music of good quality can be heard from the low-impedance speakers 25 in the private room, while reproduced stereo music from high-impedance speakers 24 can be heard as background music (BGM) at the other places.

Figure 4:
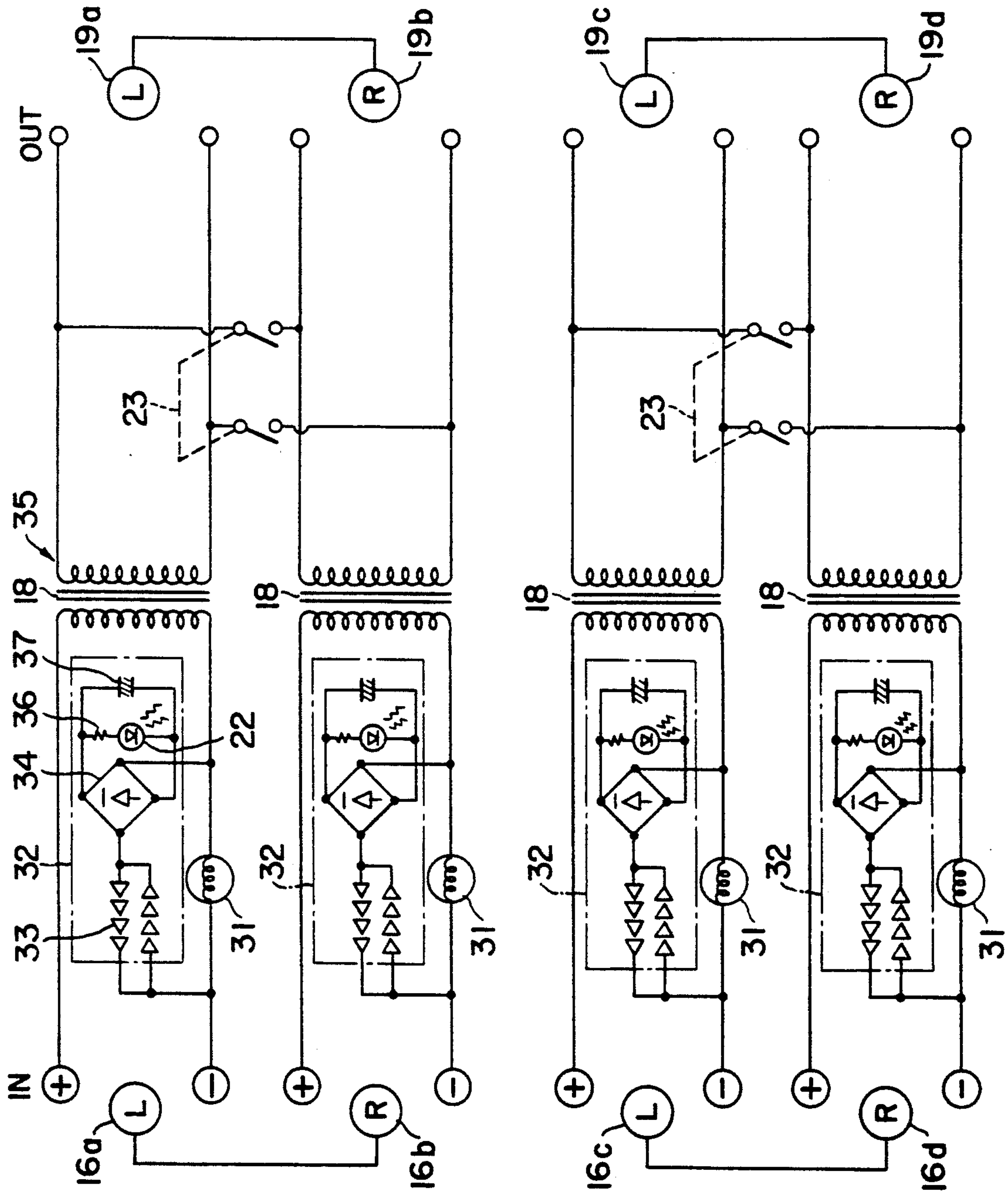
FIG. 4 is a circuit diagram showing another example of an impedance conversion device according to the invention.

In another example of an impedance conversion device 35 according to the present invention as shown by circuit diagram in FIG. 4, incandescent lamps 31 are connected in series together with input terminals 16*a*, 16*b*, 16*c*, and 16*d* in the circuits on the primary sides (circuits on the left-hand side as viewed in FIG. 4) of step-up transformers 18. Each of these incandescent lamps 31 has the characteristic of having a resistance which increases with increasing current. By the installation of these incandescent lamps 31, protective function against overcurrent is afforded.

Across the two terminals of each incandescent lamp 31 is parallelly connected on LED-light-emitting circuit 32 containing a light-emitting component (LED) 22. Within each LED-light-emitting circuit 32 are provided a diode array 33 for adjusting the level of the LED light emission, a rectifier diode 34 for enhancing luminous efficacy, a resistor 36 for adjusting the LED light-emitting current, and a condenser (capacitor) 37 for enhancing luminous efficacy similarly as the rectifier diode 34.

Output terminals 19*a*, 19*b*, 19*c*, and 19*d* are provided respectively in the circuits on the secondary side (right-hand circuits as viewed in FIG. 4) of the step-up transformers 18. Further, mode switches 23 for connecting left-hand (L) circuits and right-hand (R) circuits are provided in the circuits of the secondary side. These mode switches 23 operate to mix sound signals flowing respectively through the left and right circuits, whereby monaural mixing is possible.

To the output terminals 19*a* through 19*d* of the impedance conversion device 35 are connected a plurality of high-impedance speakers 24. Similarly as in the preceding example, these speakers 24 are provided so as to enable binaural listening to 2-channel stereo music. In the operation of the instant example of the above described organization, a sound signal transmitted from the sound source 11 is amplified in the low-impedance amplifier 12 and is then sent to the impedance conversion device 35. In the impedance conversion device 35, low impedance is converted into high impedance by the step-up transformers 18. As a result, speaker output can be obtained with high impedance.

In the case where an excessively larger current flows through the impedance conversion device 35 during this operation, the resistances of the incandescent lamps 31 in the circuits on the primary side increase, and flow of overcurrent through the speakers is suppressed. Furthermore, when the resistances of the incandescent lamps 31 increase, and the difference between the voltages of the opposite terminals of each lamp 31 increases, the LED 22 is lit. Thus it can be confirmed that an overcurrent has flowed. By the installation of the incandescent lamps 31, and the LED 22 in this manner, it becomes possible to control overcurrent through the speakers 24 while confirmation is carried out visually and as transmission of the sound signal is continued without interruption. Thus protection of the speakers and continuous sustaining of reproduction of sound can be obtained.

According to the present invention as described above, by merely connecting an impedance conversion device to a low-impedance amplifier, stereo music or sound can be reproduced simply and readily with the use of high-impedance speakers. Furthermore, since the impedance conversion device is freely attachable and detachable, a high-impedance sound system can be organized at low cost by using a relatively low-price low-impedance amplifier generally sold on the market.

What is claimed is:

1. A sound system comprising: a sound source for generating sound signals; a low-impedance amplifier for amplifying said sound signals; a plurality of high-impedance loudspeakers for reproducing audible sound from the sound signals thus amplified; and am impedance conversion device installed in a freely connectable and disconnectable manner between said amplifier and said loudspeakers and provided with a transformer section and connection terminals respectively of said amplifier and of said loudspeakers, said transformer section comprising a plurality of step-up transformers each having a primary side circuit which is connectable to the output side of said low-impedance amplifier, and in which a light-emitting circuit and an incandescent lamp are connected in parallel, said light-emitting circuit comprising a diode array, a rectifier diode for enhancing efficacy, a resistor for adjusting the light-emitting current, a light-emitting component, and a capacitor for enhancing luminous efficacy in concert with said rectifier diode.

* * * * *